(12) United States Patent
Santo et al.

(10) Patent No.: US 9,362,092 B2
(45) Date of Patent: Jun. 7, 2016

(54) GAS DISPERSION DISC ASSEMBLY

(71) Applicant: LGS Innovations LLC, Florham Park, NJ (US)

(72) Inventors: Mike Santo, Florham Park, NJ (US); Hugo Safar, Florham Park, NJ (US)

(73) Assignee: LGS INNOVATIONS LLC, McLean, VA (US)

( * ) Notice: Subject to any disclaimer, the term of this patent is extended or adjusted under 35 U.S.C. 154(b) by 644 days.

(21) Appl. No.: 13/708,028

(22) Filed: Dec. 7, 2012

(65) Prior Publication Data

US 2014/0158786 A1    Jun. 12, 2014

(51) Int. Cl.
*B05B 1/00* (2006.01)
*H01J 37/32* (2006.01)
*C23C 16/455* (2006.01)

(52) U.S. Cl.
CPC ..... *H01J 37/32853* (2013.01); *C23C 16/45565* (2013.01); *H01J 37/3244* (2013.01); *H01J 37/3288* (2013.01); *H01J 37/32449* (2013.01)

(58) Field of Classification Search
CPC ............ H01J 37/32853; H01J 37/3244; H01J 37/32449; H01J 37/3288; C23C 16/45565; B05B 1/005

USPC ............. 239/1, 548, 553, 554, 555, 557, 566, 239/568
See application file for complete search history.

(56) References Cited

U.S. PATENT DOCUMENTS

| 4,486,665 | A | * | 12/1984 | Leung et al. | 250/427 |
|---|---|---|---|---|---|
| 5,216,330 | A | * | 6/1993 | Ahonen | 315/111.51 |
| 7,034,285 | B2 | * | 4/2006 | Ichiki et al. | 250/251 |
| 2004/0129211 | A1 | * | 7/2004 | Blonigan et al. | 118/715 |

OTHER PUBLICATIONS

Edwards, Lee Ann; Santo, Mike; Purchase Order No. GOV0009926; LGS Bell Labs Innovations; Mar. 3, 2010; 4 pages.
Santo, Mike; Shower Head—Flat Bottom Surface; Drawing; Mar. 10, 2010; 1 page.
Santo, Mike; Showerhead Ring; Drawing; Mar. 10, 2010; 1 page.

* cited by examiner

*Primary Examiner* — Ryan Reis
*Assistant Examiner* — Viet Le
(74) *Attorney, Agent, or Firm* — Baker and Hostetler LLP (57) ABSTRACT

An apparatus includes a gas dispersal plate and an adapter structure. The gas dispersal plate has a plurality of gas dispersion orifices, wherein one or more of the gas dispersion orifices have a first portion with a first cross-section configured to allow entry of gas and a second portion having a second cross-section configured to allow exit of gas, the first cross-section being smaller than the second cross-section.

10 Claims, 8 Drawing Sheets

GAS DISPERSION DISC ASSEMBLY

TECHNICAL FIELD

This application is directed, in general, to semiconductor process tools.

BACKGROUND

This section introduces aspects that may be helpful to facilitating a better understanding of the inventions. Accordingly, the statements of this section are to be read in this light and are not to be understood as admissions about what is in the prior art or what is not in the prior art.

Many semiconductor process tools rely on injection of one or more reaction and/or carrier gases into a plasma chamber. Gas mixing and flow characteristics are determined in part by a gas-dispersing showerhead that allows the gas or gases to flow into the chamber in a controlled fashion. Such controlled flow may result in more predictable, e.g. more uniform, processing, such as etch or depositions rates.

SUMMARY

One aspect provides an apparatus. The apparatus, in the aspect, includes a gas dispersal plate having a plurality of gas dispersion orifices, wherein one or more of the gas dispersion orifices have a first portion with a first cross-section configured to allow entry of gas and a second portion having a second cross-section configured to allow exit of gas, the first cross-section being smaller than the second cross-section.

Another aspect provides a method, e.g. for forming a photonic device. The method includes providing radio-frequency power to a process chamber of a semiconductor process tool, and flowing a process gas from a gas source into the process chamber through gas dispersion orifices located in a gas dispersal plate. One or more of the gas dispersion orifices have a first portion with a first cross-section configured to allow entry of gas and a second portion having a second cross-section configured to allow exit of gas, the first cross-section being smaller than the second cross-section.

Yet another aspect provides an apparatus. The apparatus, in this aspect, includes a gas dispersal plate. The gas dispersal plate comprises a plurality of gas dispersion orifices formed there through, wherein one or more gas dispersion orifices from the plurality of gas dispersion orifices are configured such that a longitudinal axis of the one or more orifices are at an angle (θ) of at least 2 degrees from perpendicular, as it relates to a lower surface of the gas dispersal plate.

BRIEF DESCRIPTION

Reference is now made to the following descriptions taken in conjunction with the accompanying drawings, in which:

FIGS. 3A-5B schematically illustrate aspects of a gas distribution plate, e.g. the showerhead plate of FIGS. 2A, 2B, 2D and 2E, according to various embodiments;

DETAILED DESCRIPTION

Figure 1A:
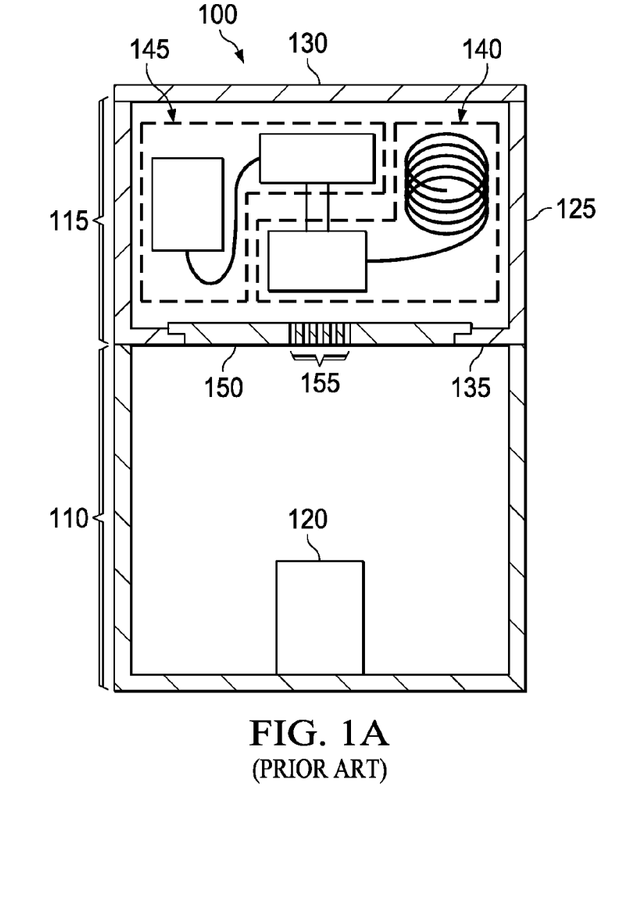
FIGS. 1A and 1B schematically illustrate a prior art semiconductor processing system, or tool, such as for performing a plasma process, e.g. etching or depositing a material layer.
Figure 1B:
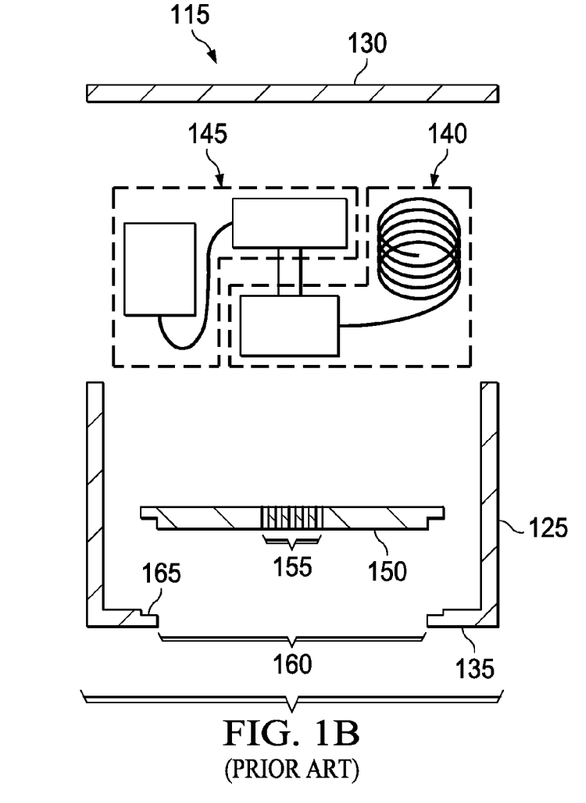

FIGS. 1A and 1B schematically illustrate aspects of a prior art plasma processing system, or tool, 100. As understood by those skilled in the pertinent art, a "processing system" or "processing tool" may include various components such as power and reactant delivery subsystems, one or more vacuum chambers, and substrate (wafer) handling subsystems. Typically such systems process materials located on semiconductor substrates. In the present example, the tool 100 includes a process chamber 110 and a chamber head 115. The process chamber 110 includes a processing stage 120 upon which a device substrate, e.g. a semiconductor wafer, may rest during processing. The chamber head 115 includes an enclosure 125, a service panel 130 and a floor panel 135. An RF power generator 140 and a gas source 145 are located within the chamber head 115. The gas source 145 routes process gases, e.g. one or more reactant and/or carrier gases and/or vaporized process constituents, to a showerhead 150. The showerhead 150 includes orifices 155 through which the process gases pass to the process chamber 110 during processing. The gas source 145 may include any conventional or novel apparatus to provide a desired flow of process gases to the process chamber 110. In some embodiments, for example, the gases are provided by external tanks to the gas source 145, and the gas source 145 includes flow controllers, gas injectors, etc. as needed to provide a controlled flow and relative concentration of the process gasses. The specific implementation of the gas source 145 is beyond the scope of this disclosure.

As appreciated by those skilled in the pertinent art, the process tool 100 may energize a plasma based on the process gases. The process provided by the tool 100 may be used to deposit or to etch material layers on the device substrate. The showerhead 150 may act to provide the gas or gases in a pattern or in locations that result in, e.g. a desired process uniformity at the surface of the processed substrate. The showerhead 150 is typically a low-maintenance component of the tool 100, rarely or almost never being responsible for significant tool downtime.

However, the inventors have found that some specialty or innovative processes may cause the showerhead 150 to become unreliable, e.g. by leading to clogging of one or more of the orifices 155. For example, formation of some optical device materials, e.g. dielectrics doped with one or more rare earth (RE) elements, may include using a source gas including the desired RE dopant(s). As used herein a rare earth element refers to one of the lanthanide elements (La, Ce, Pr, Nd, Pm, Sm, Eu, Gd, Tb, Dy, Ho, Er, Tm, Yb and Lu), scandium (Sc) or yttrium (Y). Of these elements, erbium (Er) and ytterbium (Yb) are used in some optical materials, for instance to confer nonlinear optical properties, and/or electro-optical properties on a core or cladding of an optical waveguide. The following discussion may refer in some instances to erbium and/or ytterbium as examples of rare earth elements, but such use does not limit embodiments of the disclosure to the use of these elements.

The inventors have found that source gases including a rare earth element may over time form deposits within some of the orifices 155, reducing or blocking gas flow through those orifices. Such clogging may result in nonuniform characteristics of etch or deposition processes performed by the processing tool, or to tool faults in more extreme cases. Thus, when such clogging occurs, the showerhead 150 typically must be cleaned to remove material from the orifices 155, or replaced.

FIG. 1B illustrates an exploded view of the chamber head 115 in isolation. The showerhead 150 fits within an opening 160 in the floor panel 135. The floor panel 135 may include a recess 165 that extends around the perimeter of the opening 160 and aids positioning and stabilizing the showerhead 150. Disassembly typically requires first removing the service panel 130 to access the RF power generator 140 and the gas source 145. This equipment is removed to expose the showerhead 150, which is removed from the floor panel 135 via the top of the chamber head 115.

The showerhead 150 may then be cleaned, e.g. in a chemical bath, to remove the material clogging the orifices 155. After cleaning, the showerhead 150 may be reinstalled in the chamber head 115. Removing and reinstalling the showerhead 150 may require many hours of labor, incurring significant expense in direct labor costs and opportunity costs when the process tool 100 is unavailable for use. Thus, while the conventional showerhead 150 may provide acceptable performance for many types of processes, the conventional showerhead 150 imposes significant maintenance costs when used with the aforementioned specialty processes.

The inventors have recognized that legacy process tools employing the conventional showerhead 150 may be improved by the use of a showerhead design according to various embodiments of the disclosure that allows the improved showerhead to be removed from underside of the chamber head 115. The chamber head 115 may be separated from the process chamber 110 to expose the improved showerhead. The improved showerhead may be removed, cleaned and reinstalled, or replaced with a new or previously serviced showerhead. The chamber head 115 may then be rejoined to the process chamber 110 to resume processing. The service operation may be completed in 4-8 hours instead of 40-50 hours as typically needed to service the process tool 100 having the conventional showerhead 150. The resulting reduction of tool downtime may significantly reduce the cost of ownership of the modified tool, with an associated reduction of processing costs associated with processing of material layers, e.g. doped optical material layers.

Figure 2A:
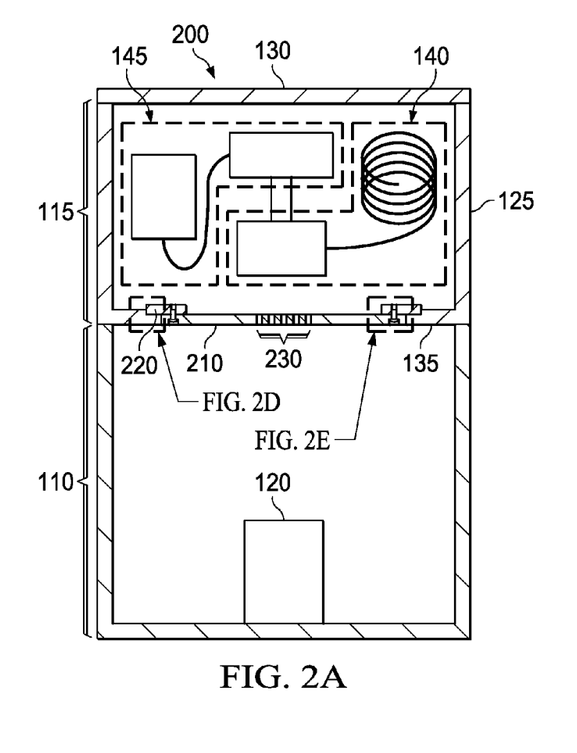
FIGS. 2A-2E schematically illustrate various aspects of a semiconductor processing system according to embodiments of the disclosure, including a showerhead plate coupled via a showerhead adapter structure, e.g. a ring, to a chamber head, such that the showerhead plate may be serviced by removing it without removing a service panel of the chamber head.

FIGS. 2A-2E illustrate aspects of a representative embodiment of a process tool 200 configured in accordance with embodiments of the disclosure. These figures are referred to concurrently in the following discussion. Turning first to FIG. 2A, the tool 200 is illustrated in sectional view. The tool 200 shares many of the features of the tool 100, with like features being referred to by like reference designators. Those skilled in the pertinent art will appreciate that the tool 200, while discussed in terms of components necessary to describe embodiments of the invention, is representative of processing tools of diverse configurations and complexity.

The tool 200 includes the process chamber 110 and the chamber head 115 as previously described. However, the showerhead 150 is replaced by a two-piece showerhead assembly including a showerhead plate, or disk, 210 (e.g., also referred to as a gas dispersal plate) and an adapter 220 formed according to various embodiments of the disclosure.

The showerhead plate 210 includes gas orifices 230 that may be configured conventionally, but embodiments are not so limited. Referring to FIG. 2C, the opening 160 may be circular, with a diameter $\phi_1$. However, embodiments of the showerhead plate 210 and adapter 220 are not limited to use with circular openings 160. A portion 240 of the adapter 220 (FIG. 2D shows reference 210) with a width L rests within the recess 165 to support the showerhead plate 210. (See FIG. 2D.) The presence of the recess 165 is optional. In embodiments in which the recess 165 is absent, the portion 240 may rest directly on the floor panel 135. A remaining portion 250 of the adapter 220 extends beyond the recess 165 and provides a surface to which the showerhead plate 210 may be joined. (See FIG. 2B.)

The showerhead plate 210 fits within the opening 160 and overlaps the adapter 220. The showerhead plate 210 may have the same shape as the opening 160 and may be sized slightly smaller to provide clearance between the showerhead plate 210 and the floor panel 135. Referring to FIG. 2E, and as described further below, the showerhead plate 210 includes mounting holes 310 (FIG. 3A) distributed around its perimeter. The adapter 220 includes corresponding mounting holes 410 (FIG. 4). The showerhead plate 210 may be attached to the adapter 220 using unreferenced screws or similar fasteners.

Figure 2B:
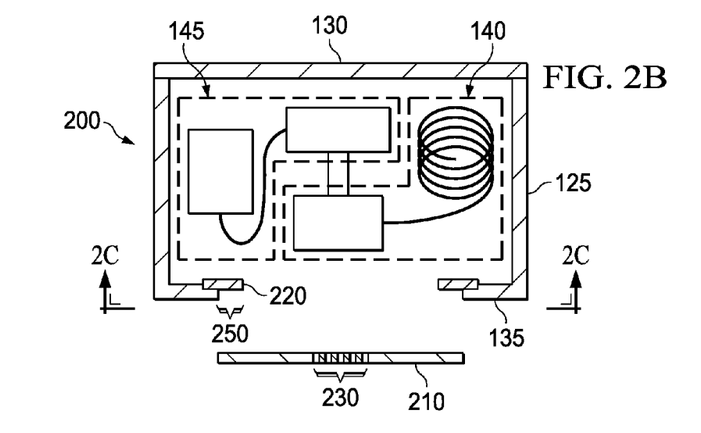
Figure 2C:
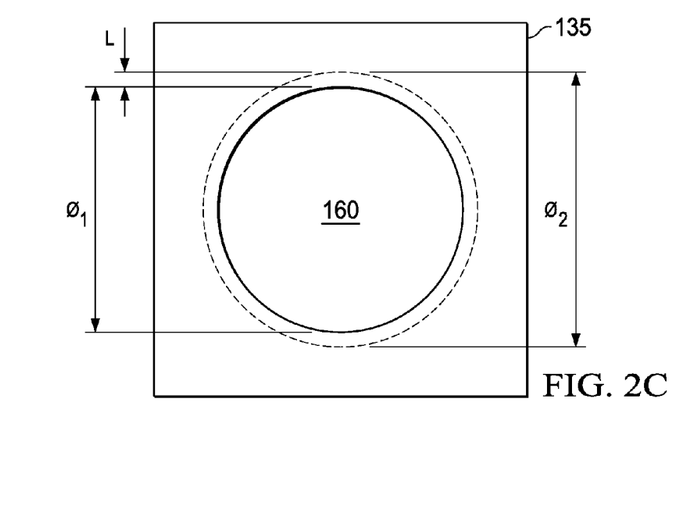
Figure 2D:
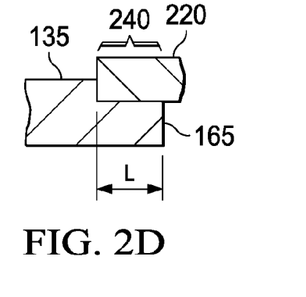
Figure 2E:
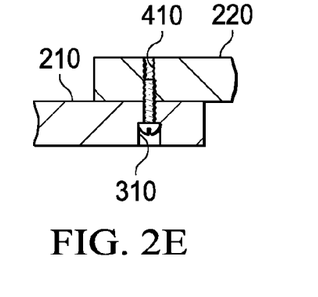

Referring to FIG. 2B, the showerhead plate 210 may be detached from the adapter 220 without removing the service panel 130. This allows the showerhead plate 210 to be removed easily for cleaning or replacement, significantly reducing the time and expense associated with servicing the showerhead plate 210. After servicing the showerhead plate 210, it may be reattached to the adapter 220 and returned to service.

Figure 3A:
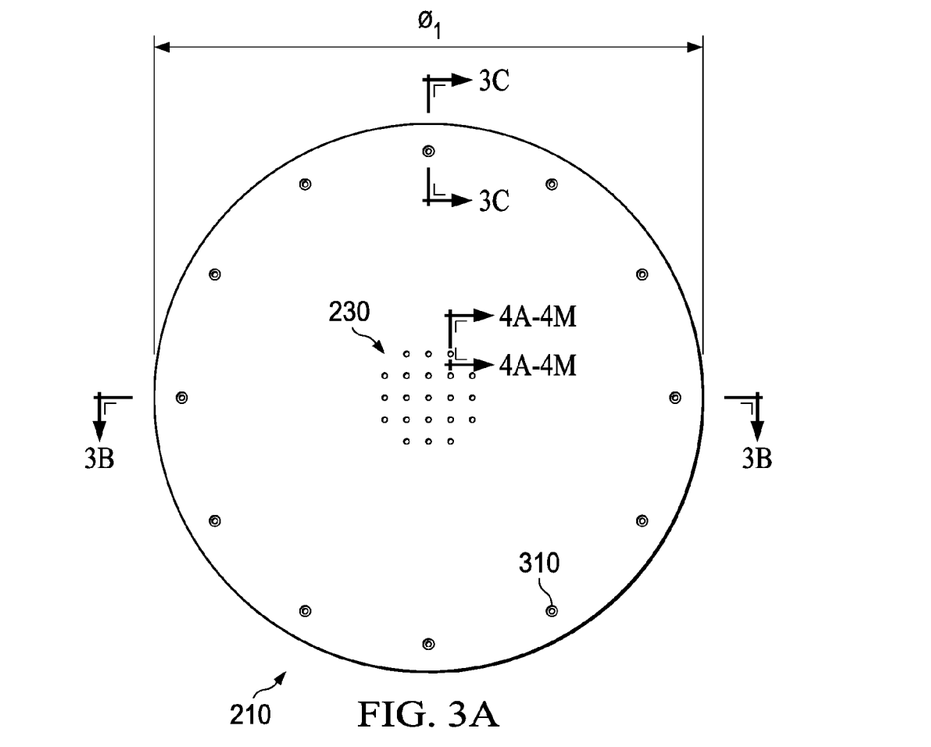

FIGS. 3A-3D illustrate aspects of the showerhead plate 210 (e.g., also referred to as a gas dispersal plate) in greater detail in a representative and nonlimiting embodiment. Referring to FIG. 3A, the illustrated embodiment of the showerhead plate 210 is illustrated as circular symmetric, but embodiments of the disclosure are not so limited. While the circular symmetry of the showerhead plate 210 may offer some advantages, such as each of manufacturing and installation, the showerhead plate 210 could instead be, e.g. polygonal, and may optionally be keyed to provide a single allowed orientation when installed. The showerhead plate 210 may be formed from any desired material, e.g. metal or ceramic. Without limitation, the material may be non-anodized, black-anodized or gold-anodized aluminum.

Figure 3B:
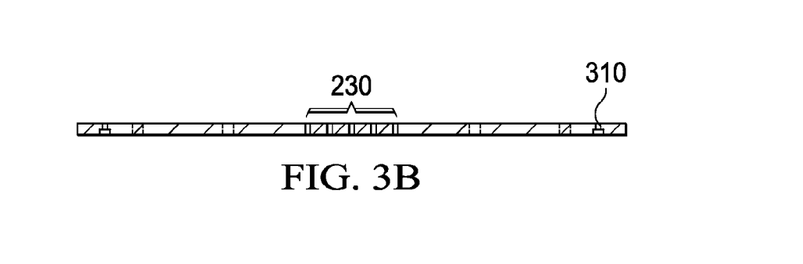

FIG. 3B illustrates a sectional view of one representative embodiment of the showerhead plate 210 along the section line 3B-3B of FIG. 3A. In the illustrated embodiment the showerhead plate 210 is illustrated as a flat, e.g. about planar, plate. However, embodiments are not so limited. For example, the showerhead plate may be concave or convex without departing from the scope of the disclosure.

As described earlier, the showerhead plate 210 includes a number of mounting holes 310. In the illustrated embodiment the mounting holes 310 are distributed substantially uniformly around the perimeter. The showerhead plate 210 also includes the previously described plurality of gas orifices 230. The illustrated embodiment shows 21 individual gas orifices 230, but embodiments are not so limited. For example, in some embodiments the showerhead plate 210 includes hundreds of instances of the gas orifice 230. The number of the gas orifices 230, and the pattern formed by the gas orifices 230, may be any number and pattern as determined to meet the needs of the processes performed by the tool in which the showerhead plate 210 is installed. The gas orifices 230 are also illustrated being localized in a central region of the showerhead plate 210, but embodiments are not limited to such placement. While such a localization may be advantageous in some processes, e.g. to promote uniformity of various processes performed by the system 200, embodiments of the showerhead plate 210 are not so limited.

Figure 3C:
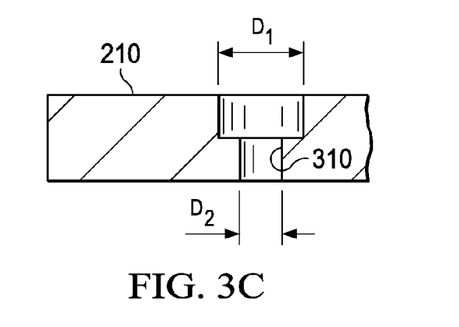

FIG. 3C illustrates without limitation an example embodiment of one instance of the mounting hole 310. The mounting hole 310 includes an optional wider counterbored portion and a narrower portion. The wider portion has a diameter $D_1$ and a counterbore depth that at least partially encloses a fastener head when the showerhead plate 210 is fastened to the adapter 220. The narrower portion may have a diameter $D_2$ appropriate to a through-hole dimension associated with the fastener. The diameters $D_1$ and $D_2$, and the counterbore depth are not limited to any particular value.

Figure 4A:
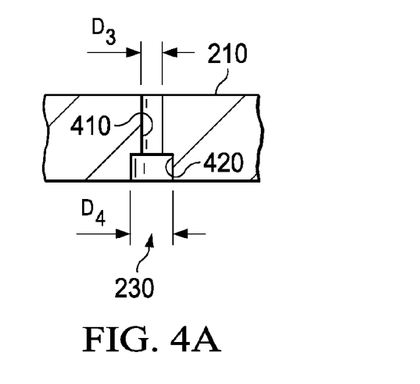

FIG. 4A illustrates without limitation an example embodiment of one instance of the gas orifice 230. The gas orifice 230, in this embodiment, includes a smaller entrance portion 410 and a larger exit portion 420. The smaller entrance portion 410 of the gas orifice 230 would be that portion of the gas orifice 230 that initially receives the process gas from the gas source (e.g., the gas source 145 illustrated in FIG. 2A). The larger exit portion 420 of the gas orifice 230 would be the portion of the gas orifice 230 that subsequently receives the process gas from the gas source, and additionally the closest portion of the gas orifice 230 to the process stage (e.g., the process stage 120 illustrated in FIG. 2A), thereby being identified as exit portion. The relative terms smaller and larger are, in this context, indicative of respective cross-sections (e.g., diameters in one embodiment) of the two portions wherein one is larger than the other. The smaller entrance portion 410 and larger exit portion 420 of the gas orifice 230 can be used to strategically create symmetrical (about the center of the showerhead plate 210) or random (i.e., non-symmetrical) gas flow from the showerhead plate 210. For example, certain designs of the smaller entrance portion 410 and larger exit portion 420 of the gas orifice 230 may be used to create local vortices as the process gas exits through the showerhead plate 210, which may lead to produce more homogeneous films with more uniform thickness.

In the particular embodiment of FIG. 4A, the gas orifice 230 having the smaller entrance portion 410 and larger exit portion 420 is configured as a counter-bore. In this example embodiment, the smaller entrance portion 410 might have a diameter $D_3$, and the larger exit portion 420 might have a diameter $D_4$. The specific dimensions of the gas orifice 230 are not limited to any particular values in this embodiment, but for the requirement that the gas orifice 230 have a smaller entrance portion 410 and a larger exit portion 420. For example, the diameter $D_3$ and diameter $D_4$ of the gas orifices 230 may be of any size appropriate to the process constituents and/or gas flow rates used in the process. A skilled practitioner may select the diameter $D_3$ and diameter $D_4$, in accordance with this disclosure, with the objective of achieving uniform deposition without clogging the orifices 230.

Figure 4B:
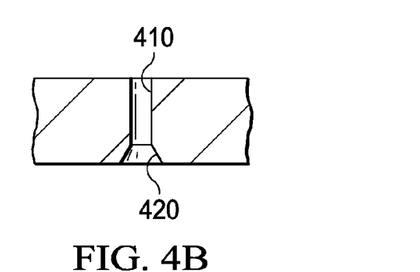
Figure 4C:
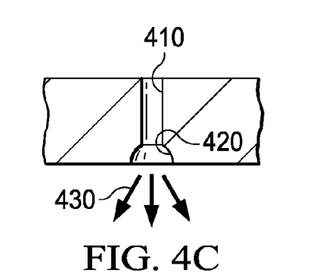
Figure 4D:
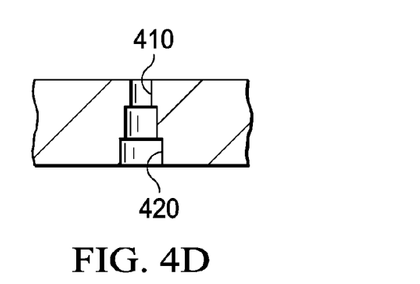
Figure 4E:
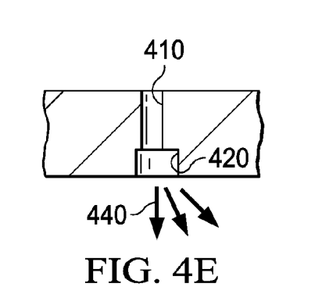
Figure 4F:
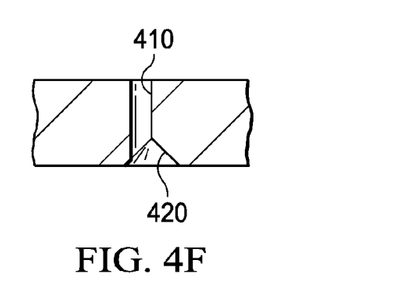
Figure 4G:
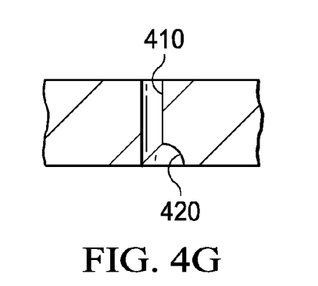

FIGS. 4B through 4G illustrate various other gas orifices 230 in accordance with this disclosure, each of the gas orifices 230 illustrated in FIGS. 4B through 4G having a smaller entrance portion 410 and a larger exit portion 420. Specifically, FIG. 4B illustrates one embodiment wherein the gas orifice 230 is a counter-sink. FIGS. 4C and 4D, on the other hand, illustrate other embodiments wherein the gas orifices 230 are spherical (end mill) and tapered hole designs, respectively. Likewise, FIGS. 4E and 4F illustrate other embodiments wherein the gas orifices 230 are off-centered spherical (end mill) and off-centered counter-sink designs, respectively. Additionally, FIG. 4G illustrates an alternative design wherein the gas orifice 230 is an off-centered counter-bore design. Of the embodiments of FIGS. 4A through 4G, the gas orifices 230 of FIGS. 4A through 4D might provide symmetrical dispersion (e.g., as shown by the arrows 430 in FIG. 4B, wherein the process gas exits the gas orifices in a substantially symmetrical pattern), whereas the gas orifices 230 of FIGS. 4E through 4G might provide directional dispersion (e.g., as shown by the arrows in FIG. 4E, wherein the process gas exits the gas orifices 230 in directional pattern (e.g., to the right in this example)).

Turning briefly to FIGS. 4H through 4N, illustrated are alternative embodiments for the gas orifices 230. In each of the embodiments of FIGS. 4H through 4N, the gas orifices 230 exit the showerhead plate 210 at angle. For example, a longitudinal axis of the gas orifices 230 is at an angle ($\theta$) of at least 2 degrees from perpendicular, as it relates to a lower surface of the gas dispersal plate. Lower surface, as that term is used in this context, is meant to relate to the bottom surface defined by the entire body of the showerhead plate as opposed to a specific smaller bottom surface on the showerhead plate that may have a different shape. By having the gas orifices 230 exit the showerhead plate 210 at angle ($\theta$) of at least 2 degrees from perpendicular, directional dispersion of the process gas may more easily be achieved. While the angle ($\theta$), in this particular embodiment, is a minimum of 2 degrees, many other embodiments exist wherein the angle ($\theta$) ranges from about 15 degrees to about 75 degrees. Nevertheless, the angle ($\theta$), assuming it is at least 2 degrees, may be of any angle appropriate to the process constituents and/or gas flow rates used in the process. A skilled practitioner may select the angle ($\theta$), in accordance with this disclosure, with the objective of achieving uniform deposition without clogging the orifices 230.

Figure 4H:
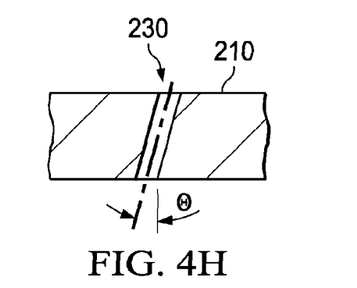
Figure 4I:
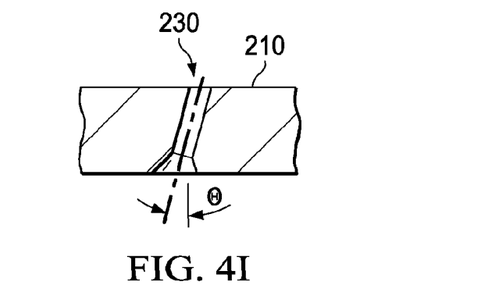
Figure 4J:
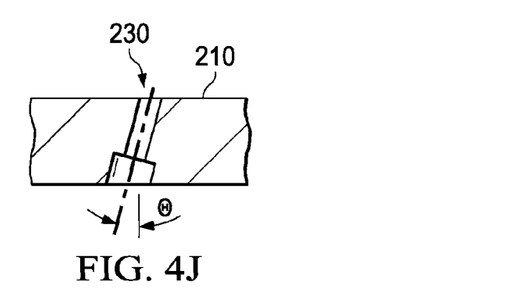
Figure 4K:
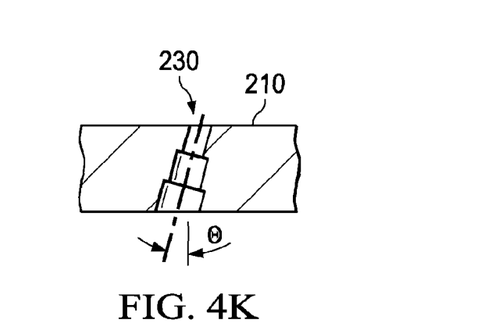
Figure 4L:
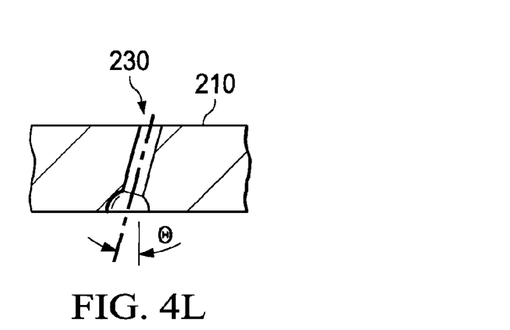
Figure 4M:
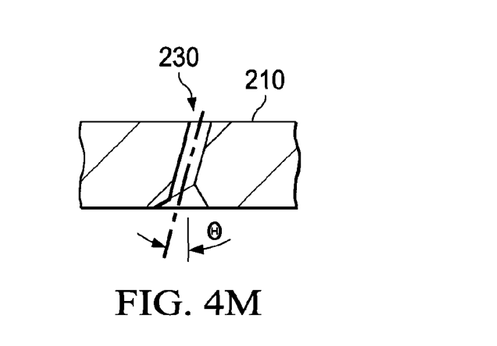
Figure 4N:
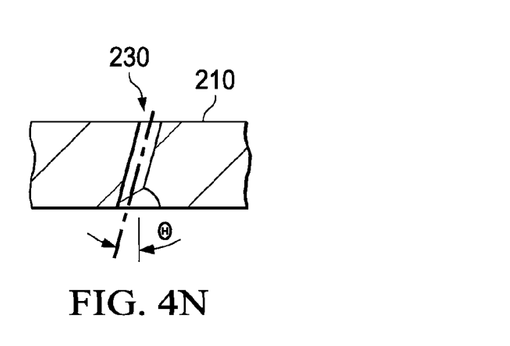

FIG. 4H, in the illustrated embodiment, illustrates a single diameter gas orifice 230 exiting the showerhead plate 210, wherein it is configured such that its longitudinal axis is at an angle ($\theta$) of at least 2 degrees from perpendicular, as it relates to a lower surface of the gas dispersal plate. FIGS. 4I through 4L illustrate counter-sink, counter-bore, tapered hole, and spherical (end mill) gas orifices 230, respectively, wherein each of which is configured such that its longitudinal axis is at an angle ($\theta$) of at least 2 degrees from perpendicular, as it relates to a lower surface of the gas dispersal plate. FIGS. 4M and 4N, on the other hand, illustrate off-centered counter-sink and off-centered spherical (end mill) gas orifices 230, respectively, each of which is configured such that its longitudinal axis is at an angle ($\theta$) of at least 2 degrees from perpendicular, as it relates to a lower surface of the gas dispersal plate. Other designs within this angled gas orifice 230 embodiment are within the scope of this disclosure.

Figure 5A:
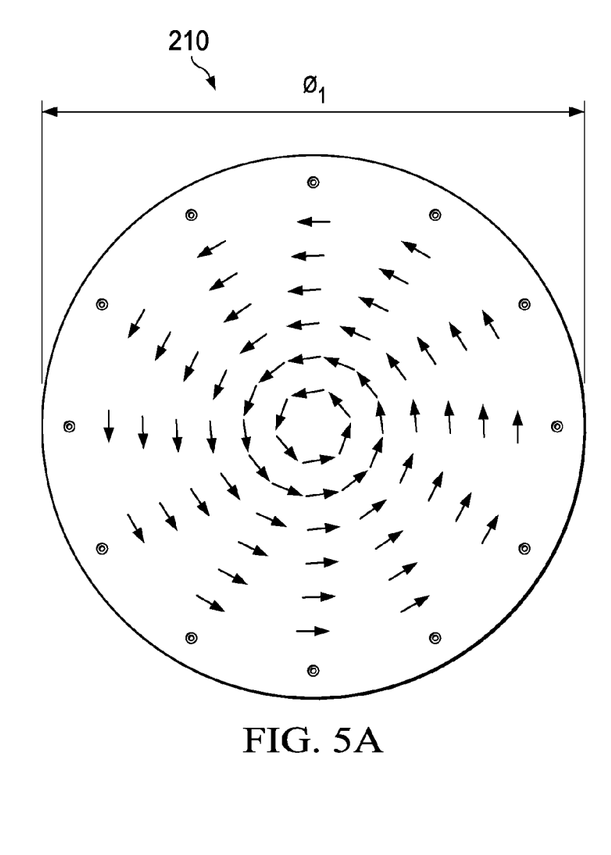
Figure 5B:
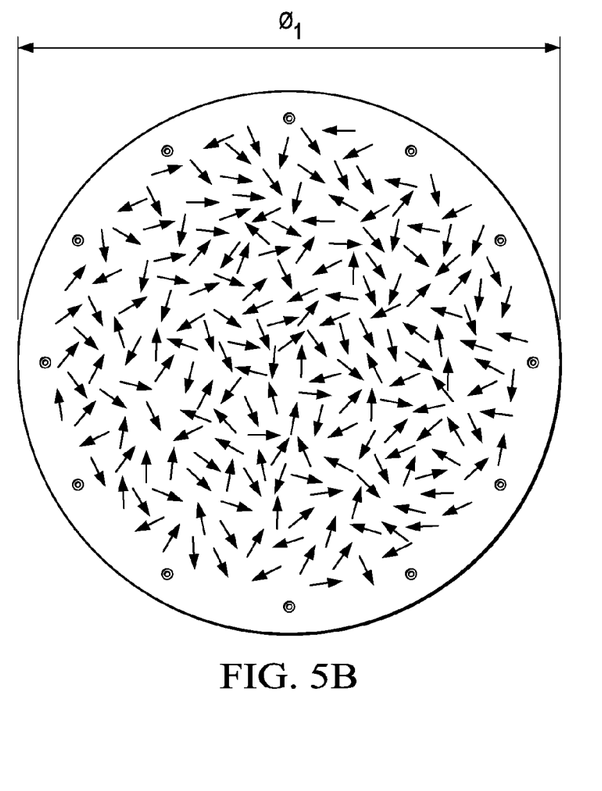

FIGS. 5A and 5B illustrate various different embodiments of which the angled gas orifices 230 of FIGS. 4I through 4N may be placed upon the showerhead plate 210. FIG. 5A illustrates that the angled gas orifices 230 may be purposefully positioned. For example, in the embodiment of FIG. 5A the gas orifices 230 are substantially evenly spaced in a consistent and repeatable fashion. Further to the embodiment of FIG. 5A, the gas orifices 230 radiate from the center of the disk, each at the same consistent angle ($\theta$). Accordingly, at least in this embodiment, the gas dispersion is substantially rotationally unidirectional, for example in a circular flow.

FIG. 5B, on the other hand, illustrates that the angled gas orifices 230 may be randomly positioned. For example, in the embodiment of FIG. 5B, the gas orifices 230 are positioned in random directions from adjacent gas orifices 230. Moreover, the angle ($\theta$) of adjacent gas orifices 230 may vary. Accordingly, at least in this embodiment, the gas dispersion direction is substantially rotationally omnidirectional.

Figure 6A:
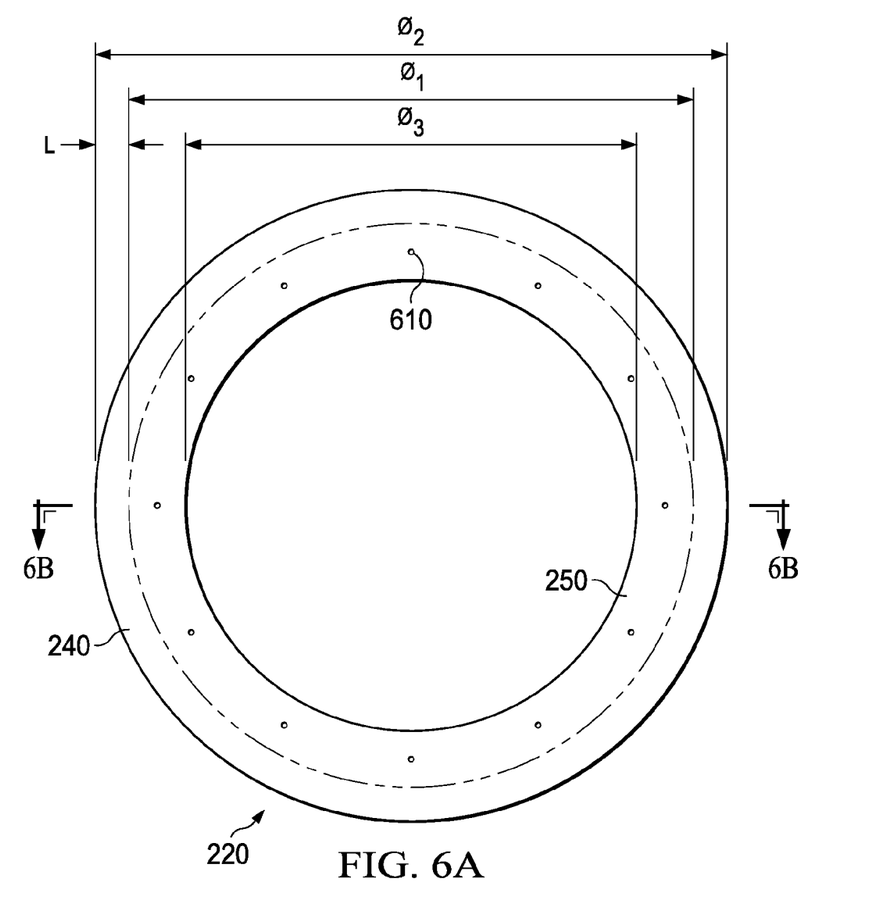
FIGS. 6A and 6B schematically illustrate a showerhead adapter structure according to representative embodiments, in which the adapter structure, e.g. a ring, is configured to be fastened to the showerhead plate of FIG. 3A, leaving a circumferential portion that is uncovered by the gas distribution plate.
Figure 6B:
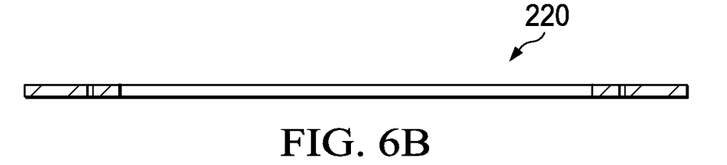

FIGS. 6A and 6B illustrate the adapter 220 in additional detail. The adapter 220 is illustrated without limitation as a circular ring structure. In some other embodiments, the adapter 220 may be configured as, e.g. a square, triangle, pentagon, hexagon, ellipse or oval. It may be preferable that the shape of adapter 220 corresponds to the shape of the showerhead plate 210. Thus, for example, in such embodiments if the showerhead plate 210 is circular, the adapter 220 is also circular, and if the showerhead plate 210 has the shape of a polygon, the adapter 220 also has the shape of the same polygon.

The adapter 220 may be formed from any desired material, e.g. metal or ceramic. Without limitation, the material may be non-anodized, black-anodized or gold-anodized aluminum. The adapter 220 has an outer diameter of $\phi_2$ and an inner diameter of $\phi_3$. The portion 240 is that portion of the adapter 220 located between $\phi_2$ and $\phi_2$–L. (See FIG. 2D.) The portion 240 provides a circumferential portion of the adapter 220 that remains uncovered by the plate 210 when the adapter 220 and the plate 210 are joined. In some embodiments, such as the illustrate embodiment, where the adapter 220 has, e.g. a circular, near circular or elliptical shape, the circumferential portion of the adapter 220 may be an annular portion. The portion 250 is that portion of the adapter 220 located between $\phi_2$–L and $\phi_3$. (See FIG. 2B.) Holes 610 are located to match the mounting holes 310 so the showerhead plate 210 may be attached to the adapter 220. The mounting holes 310 may be threaded to provide a non-permanent attachment between the adapter 220 and the showerhead plate 210.

In some embodiments the adapter 220 is formed from a different material than is the showerhead plate 210. For example, it may be advantageous to form the adapter 220 from a material in which strong threads may be formed in the holes 610, while forming the showerhead plate 210 from a material in which the gas orifices 230 may be easily machined. For example, the adapter 220 may be formed from a steel alloy, while the showerhead plate 210 may be formed from aluminum.

Figure 7:
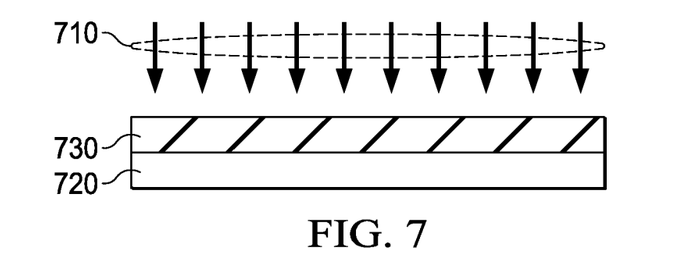
FIG. 7 schematically illustrates a photonic device at an intermediate stage of processing a material layer via a source gas provided via the showerhead plate of FIG. 3A.

FIG. 7 illustrates a representative embodiment of a process 710 operating to form features of a photonic device 720. The device 720 includes a material layer 730 that is shown at an intermediate stage of processing. The material layer 730 may be, e.g. an optical core or cladding material, such as silicon oxide, silicon nitride or silicon oxynitride. In some embodiments the process 710 is a plasma etch process using a gas or mixture of gases provided by the gas source 145 via the showerhead plate 210 to remove portions of the layer 730 to form features of the device 720, such as waveguides. In other embodiments the process 710 is a plasma deposition process using the gas or mixture of gases delivered by the showerhead plate 210 to form the layer 730. The gas or gases may include a compound including a rare earth element, such as to dope the material layer 730 to have desired optical characteristics. As described previously the rare earth element in some embodiments may be erbium and/or ytterbium.

Figure 8:
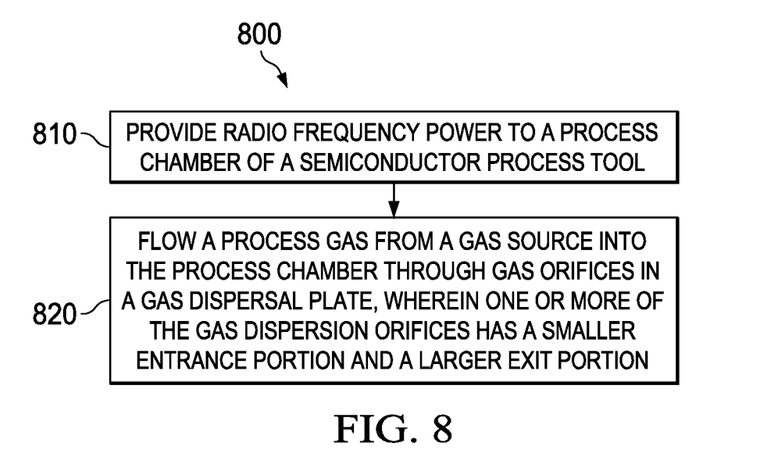
FIG. 8 presents a method according to one embodiment, e.g. for forming an optical device.

FIG. 8 presents a method 800 for forming an optical device, in a nonlimiting embodiment. The steps of the method 800 are described without limitation by reference to elements previously described herein, e.g. in FIGS. 1-7. The steps of the method 800 may be performed in another order than the illustrated order, and in some embodiments may be omitted altogether.

In a step 810 radio-frequency power is provided to a process chamber of a semiconductor process tool, e.g. the process chamber 110. In a step 820 a process gas from a gas source, e.g. the gas source 145, is caused to flow into the process chamber through gas orifices such as the orifices 230. The gas orifices are located in a gas dispersal plate, e.g. the showerhead plate 210. One or more of the gas dispersion orifices 230, in one embodiment, have a smaller entrance portion and a larger exit portion—as described above. In another embodiment, one or more of the gas dispersion orifices 230 exit the gas dispersal plate 210 at an angle (θ) of at least 2 degrees from perpendicular to a lower surface of the gas dispersal plate 230. The gas dispersal plate may be fastened to an adapter, e.g. the adapter 220, such that a circumferential portion of the adapter, e.g. the portion 240, supports the gas dispersal plate within an opening located within a chamber head from which the gas flow is controlled.

In some embodiments of the above-described method the gas orifices are localized in a central region of the plate. In some embodiments the process gas comprises a rare earth compound. In some embodiments the rare earth compound comprises erbium. In some embodiments the semiconductor process tool is configured to form an optical core or cladding material from the process gas.

Those skilled in the art to which this application relates will appreciate that other and further additions, deletions, substitutions and modifications may be made to the described embodiments.

What is claimed is:

1. An apparatus, comprising:
   a chamber head including a floor panel:
   a gas dispersal plate having a plurality of gas dispersion orifices;
   and an adapter in direct contact with the gas dispersal plate, the adapter positioned outside an area of the gas dispersal plate populated by the plurality of gas dispersion orifices, wherein
   one or more of the gas dispersion orifices has a first portion with a first cross-section configured to allow entry of gas and a second portion having a second cross-section configured to allow exit of gas, the first cross-section being smaller than the second cross-section,
   the adapter is embedded in an upper surface of the floor panel, wherein the adapter is formed separately from the floor panel,
   and the gas dispersal plate is in communication with a lower surface of the floor panel in an operational state.

2. The apparatus of claim 1, wherein the one or more gas dispersion orifices from the plurality of gas dispersion orifices are configured to disperse process gas in a substantially symmetrical fashion relative to a longitudinal axis of the one or more gas dispersion orifices.

3. The apparatus of claim 2, wherein the one or more gas dispersion orifices from the plurality of gas dispersion orifices have a structure with a design selected from the designs consisting of:
   a counter-sink design;
   a counter-bore design;
   a spherical (end mill) design; and
   a tapered hole design.

4. The apparatus of claim 1, wherein the one or more gas dispersion orifices from the plurality of gas dispersion orifices are configured to disperse process gas in a substantially directional fashion.

5. The apparatus of claim 4, wherein the one or more gas dispersion orifices from the plurality of gas dispersion orifices have a structure with a design selected from the designs consisting of:
   an off-centered counter-sink design;
   an off-centered counter-bore design; and
   an off-centered spherical (end mill) design.

6. The apparatus of claim 1, wherein the one or more gas dispersion orifices from the plurality of gas dispersion orifices are configured such that a longitudinal axis of the one or more orifices are at an angle (8) of at least 2 degrees from perpendicular, as it relates to a lower surface of the gas dispersal plate.

7. The apparatus of claim 1, wherein the angle (8) ranges from about 15 degrees to about 75 degrees.

8. The apparatus of claim 1, wherein the adapter is fastened to the gas dispersal plate such that a portion of the circumferential edge of the adapter remains uncovered by the gas dispersal plate.

9. The apparatus of claim 8, further comprising a chamber head having an enclosure, the enclosure having an opening configured to receive the circumferential portion.

10. The apparatus of claim 8, wherein the adapter has a form of a ring and the circumferential edge is an annular portion of the ring.

\* \* \* \* \*